United States Patent [19]

Cricchi

[11] Patent Number: 4,527,257
[45] Date of Patent: Jul. 2, 1985

[54] COMMON MEMORY GATE NON-VOLATILE TRANSISTOR MEMORY

[75] Inventor: James R. Cricchi, Catonsville, Md.

[73] Assignee: Westinghouse Electric Corp., Pittsburgh, Pa.

[21] Appl. No.: 411,176

[22] Filed: Aug. 25, 1982

[51] Int. Cl.³ .............................................. G11C 11/40
[52] U.S. Cl. .................................. 365/184; 365/182; 365/218
[58] Field of Search ........................ 365/182, 184, 218

[56] References Cited

U.S. PATENT DOCUMENTS 4,103,348 7/1978 Fagan .............................. 365/182 X
4,385,308 5/1983 Uchida ............................ 365/184 X Primary Examiner—Joseph A. Popek
Attorney, Agent, or Firm—Walter G. Sutcliff

[57] ABSTRACT

A non-volatile semiconductor memory is described incorporating a fixed threshold transistor and a variable threshold transistor in each memory cell. The fixed threshold transistor is used for row selection while the variable threshold transistor stores the data. A common memory gate line throughout the memory permits block erase to one logic state with opposite data being written in on a row-by-row basis. Information is read out from a selected row by a ramp voltage on the memory gate line which is capacitively coupled through variable threshold transistors having a channel in the body below the gate region.

22 Claims, 7 Drawing Figures

COMMON MEMORY GATE NON-VOLATILE TRANSISTOR MEMORY

GOVERMENT CONTRACT

The Government has rights in this invention pursuant to Contract No. F33615-80-C-1199 awarded by the Department of the Air Force.

BACKGROUND OF THE INVENTION

1. Field of the Invention:

This invention relates to non-volatile semiconductor memories and more particularly to metal nitride oxide semiconductor capacitors or transistors interconnected into an array.

2. Description of the Prior Art:

In the prior art, various non-volatile semiconductor memories have been described using metal nitride oxide semiconductor (MNOS) transistors. Normally, the source, drain and gate of the MNOS transistor are interconnected in an array of rows and columns with voltages applied to the gates of a selected row of transistors to read out the data stored in the transistor by monitoring the conductance or current flowing through the transistor. The information is stored in the MNOS transistor by applying a polarization voltage between the gate and body which causes charge to travel or tunnel into or out of the silicon nitride and silicon dioxide layer with respect to the body. The presence or absence of charge causes a shift in the threshold voltage $V_T$ of the transistor. If the MNOS transistor has a stepped gate oxide and is of the P channel type, then the transistor will be non-conducting when zero voltage is applied to the gate with respect to the body. In other words, the transistor stays in the enhancement mode due to thicker oxide regions adjacent the drain and source regions of the transistor. The enhancement mode region in MNOS N-channel transistors has a very limited threshold voltage region. In addition, the N-channel transistor has a large depletion mode region with respect to the threshold voltage. In the depletion mode, the N-channel transistor is conducting with zero volts on the gate. The various conducting transistors provide current paths which interfere with sensing the conductance of other transistors in the array.

One solution to utilizing an array of MNOS N-channel transistors is described in a publication entitled "A 16 K Bit Electrically Eraseable PROM Using N-Channel SI-Gate MNOS Technology" by Takaaki Hagiwara et al. which appeared in the IEEE Journal of Solid State Circuits, Vol. SC-15, No. 3, June, 1980 where the current passing through unselected N-channel transistors was controlled by placing in series with each transistor a second N-channel field effect transistor. FIG. 1A and 1B, for example, show an N-channel MNOS transistor in series with an N-channel MOS transistor to form a memory cell. The gate of the MOS transistors of a selected row is biased to turn the MOS transistor on which enables current to pass through both the MNOS transistor and the MOS transistor in its respective column to a sense amplifier. Of course, if the MNOS transistor is in the enhancement mode, no current will flow through it. The gate voltage of every MNOS transistor may remain at zero volts during read operation.

During write operation, the gates of the MNOS transistors of a selected row are raised to a voltage of $V_{PP}$ which may be, for example, +25 volts. The gates of unselected MNOS transistors are grounded. Writing is inhibited on selected MNOS transistors by placing 20 volts on the source. Writing is achieved on selected MNOS transistors by grounding the source. Thus, to write into the array as shown in FIG. 9 of the publication by Hagiwara et al, the appropriate circuit must operate at high voltages, 25 volts for $V_{PP}$ and 20 volts for the column inhibit lines. The gate electrodes of both the MNOS transistor and the MOS transistor as shown in FIG. 1A are of polysilicon material.

Instead of using two transistors per bit of storage, one for access and one for storage, an alternate arrangement has been described using one MOS transistor with a stepped oxide with the fixed threshold regions having a separate gate electrode from the gate electrode of the memory threshold region. Such an arrangement has been described in a publication entitled "The Gated-Access MNOS Memory Transistor" by H. A. Richard Wegener, which appeared in IEEE Transactions on Electron Devices, Vol. ED-27, No. 1, January, 1980, pages 266 through 276. The gated access transistor has a source region, fixed threshold region, a memory region, a fixed threshold region and a drain region. The oxide is thinnest in the memory or variable threshold region. The gate electrodes for the fixed threshold regions may be formed using a self-aligned silicon gate process. The transistor may be an N-channel depletion mode thereby providing a conducting or non-conducting channel in the memory region with zero volts on the memory gate. The memory gate may be aluminum. The fixed threshold regions are separately controlled during read operation to selectably detect the current or conduction through selected transistors. Thus, during read operation, the memory gates of all transistors may be held at zero volts. During write operation, a scheme is described where the write voltage is placed only on the memory gate only which is isolated by oxide from the substrate permitting it to be both positive and negative. A negative voltage on the memory gate causes positive charge to be stored in the memory gate dielectric. The fixed field effect regions together with the voltage on the source and drain region either place electrons underneath the memory region such as with zero volts on the source line or prevents electrons from entering beneath the memory region such as by putting positive ten volts on the source line. After all memory regions are preconditioned with electrons or no electrons underneath the memory region, a positive voltage is placed on the memory gate line such as +25 volts. For memory regions that contain electrons in the body of the transistor, the electrons are drawn into the dielectric and neutralize the positive stored charge thereby shifting the threshold voltage of the memory region. For memory regions containing no electronic charge in the body, no electrons are drawn into the dielectric and the positive charge previously stored is preserved. The advantage of having write voltages only on the memory gate line is that low voltage peripheral circuits to the array may be used.

It is therefore desirable to provide a non-volatile memory using an MOS N-channel field effect transistor and a MNOS device for storing charge and where information may be written and read out of the MNOS device by applying a sequence of pulses to the gate of the MNOS device.

It is further desirable to provide an array of non-volatile memory cells containing an N-channel MOS transistor and a MNOS device having an N-channel and wherein information may be written into and read out by capacitive coupling from the gate to the drain of the MNOS device.

It is further desirable to provide a non-volatile array comprised of MOS field effect transistors and MNOS devices coupled to each MOS field effect transistor wherein the MNOS device comprises a source, body, gate and gate dielectric of nitride and oxide which exhibits a variable threshold characteristic.

It is further desirable to provide a memory array of cells wherein the peripheral circuitry may be at low voltages during read operation such as five volts or less.

It is further desirable to provide a non-volatile memory comprising an array of cells, each cell having an MNOS device having a gate and source and gate dielectric exhibiting a variable threshold characteristic wherein all the gates may be coupled together and isolated from the substrate by a dielectric to permit positive and negative polarity voltages thereon.

It is further desirable to provide a non-volatile memory comprising an array of memory cells, each cell including an MNOS device wherein the entire array may be fabricated on bulk silicon or on silicon on sapphire.

SUMMARY OF THE INVENTION

In accordance with the present invention, apparatus for storing information in non-volatile form is described comprising an array of MOS field effect transistors each having a gate, source and drain region, the transistors arranged in a plurality of rows and columns, the source of each transistor in a column coupled together, the gate of each transistor in a row coupled together, the drain of each transistor coupled to the source of a non-volatile device each having a source, a gate region and a gate dielectric below the gate region having a variable threshold characteristic for storing charge. A conductive channel is formed below the gate region of the non-volatile device at times a predetermined quantity of charge is stored in the gate dielectric and no channel is formed at times the charge in the gate dielectric is below a predetermined level; the gate region of each non-volatile device in a row is coupled together.

The invention further includes a method for reading and writing non-volatile information from an MNOS device having a source, body, gate region and a variable threshold dielectric comprising the steps of placing a predetermined voltage on the source and placing a sequence of pulses on the gate region to write into and read from the device and for placing pulses of opposite polarity to read from and to write all devices to a predetermined state.

An alternate embodiment utilized a dual gate transistor with the dielectric under the first gate exhibiting fixed threshold characteristics and the dielectric under the second gate exhibiting variable threshold characteristics.

DESCRIPTION OF THE PREFERRED EMBODIMENT

Figure 1:
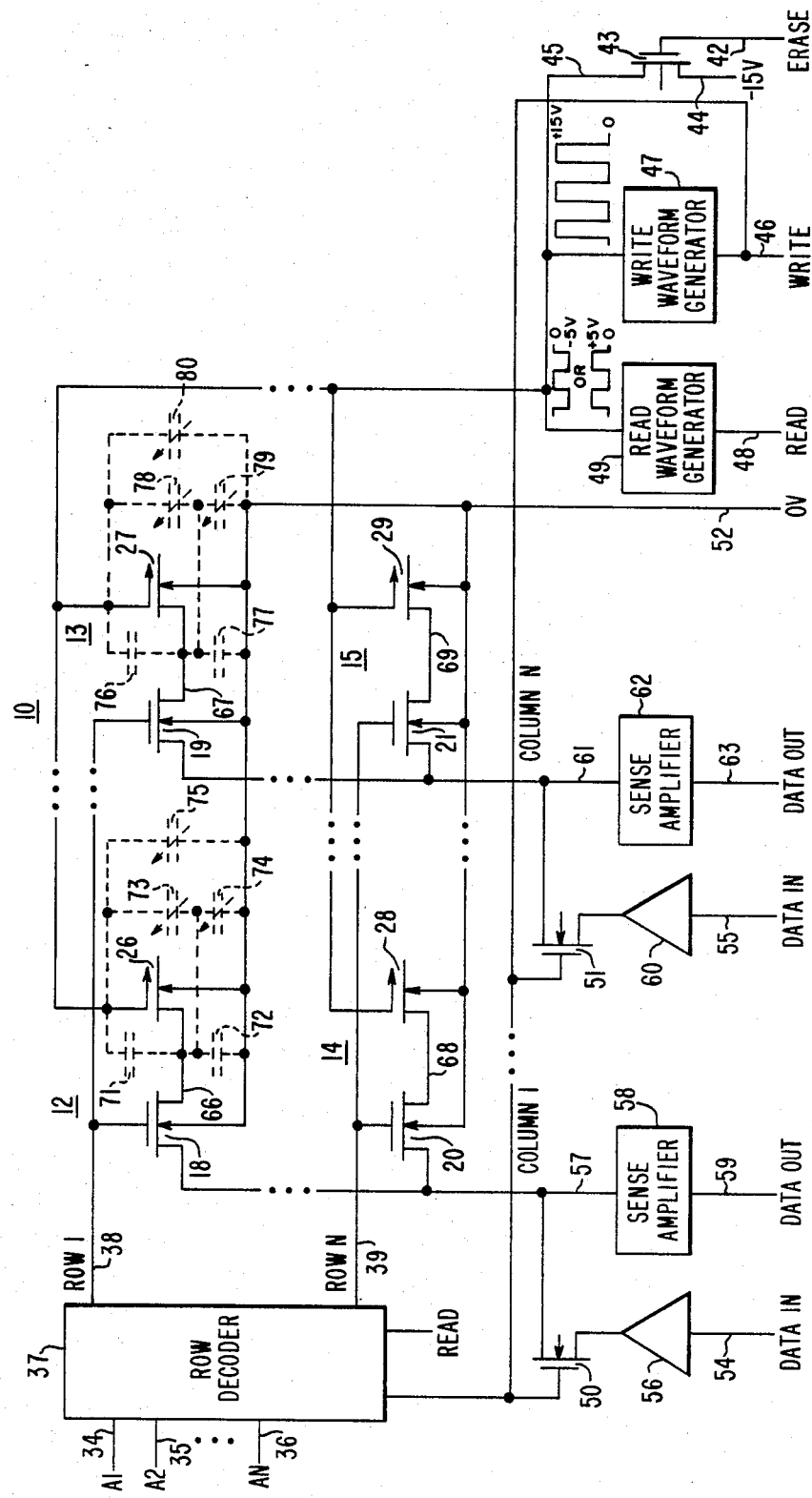
FIG. 1 is a schematic diagram of one embodiment of the invention.

Referring to the drawings, and in particular to FIG. 1, a schematic diagram is shown of non-volatile memory 10. In FIG. 1, an array of memory cells 12 through 15 are arranged in rows and columns. As shown in FIG. 1, row 1 comprises memory cells 12 and 13 and row 2 comprises memory cells 14 and 15. Column 1 comprises memory cells 12 and 14 and column 2 comprises memory cells 13 and 15. Each memory cell 12 through 15 has an N-channel field effect transistor 18 through 21, respectively. Each field effect transistor 18 through 21 has a gate electrode, source and drain region and a body.

Each memory cell 12 through 15 also has a variable threshold field effect transistors 26 through 29, respectively. Each variable threshold field effect transistor 26 through 29 has a gate electrode, a gate dielectric positioned between the gate electrode and the body of the transistor which can store charge for long periods of time, source region and a body.

Variable threshold field effect transistors 26 through 29 may, for example, be N-channel. The variable threshold characteristic should allow the transistors to be switched from the depletion mode to the enhancement mode and vice versa. When the transistors are in the depletion mode, an N-channel is formed in the body and coupled to the source region which is N-type. The N-channel is present when the voltage between the gate and body of the transistors is zero volts. When transistors 26 through 29 are in the enhancement mode, no channel is present in the body of the transistor at times the voltage between the gate and body is at zero volts. Transistors 26 through 29 may be switched from the enhancement mode to the depletion mode by applying a voltage between the gate and body of the transistor such as −15 volts which will cause electron vacancies or holes to be stored in the dielectric below the gate electrode. A transistor in the depletion mode is considered to carry or store a logic "one". When a positive voltage is placed between the gate and body of the transistors 26 through 29, the electron vacancies or holes are swept out of the gate dielectric to the body and the transistor is in the enhancement mode with no channel or inversion layer in the body of the transistor. A voltage such as +15 volts between the gate and body is sufficient to switch the transistor from the enhancement mode to the depletion mode and when the transistor is in the enhancement mode, it stores or holds a logic "zero".

Transistors 18 through 21 may be fixed threshold N-channel transistors.

Non-volatile memory 10 is addressed by address signals A1, A2 through AN on input lines 34 through 36 on row decoder 37. Row decoder 37 functions to select one of its output lines such as row 1 on line 38 or row N on line 39 in response to the logic state of address signals A1 through AN. Row 1, line 38, is coupled to the gate of transistors 18 and 19. Row N or line 38 is coupled to the gate of transistors 20 and 21.

An erase control signal is coupled over line 42 to the gate electrode of field effect transistor 43 which functions as a switch to couple −15 volts or other suitable voltage on line 44 to line 45 in response to the logic state of control signal erase. Control signal write is coupled over line 46 to an input or write waveform generator 47. Write waveform generator 47 functions to create a series of pulses from zero to +15 volts, for example, on line 45. Control signal read is coupled over line 48 to an input of read waveform generator 49 which functions to couple a sequence of pulses such as from 0 to +5 volts or 0 to −5 volts to line 45. Line 45 is coupled in common to the gate electrode of transistors 26 through 29.

The body of transistors 18 through 21 and 26 through 29 are coupled in common to line 52 which may be coupled to a potential such as 0 volts. Line 52 may be implemented, for example, by a common substrate or epitaxial layer where transistors 18 through 21 and 26 through 29 are fabricated in bulk silicon. Or line 52 may be conductive material interconnecting the body of the transistors which may, for example, be fabricated on silicon islands over an insulating substrate such as sapphire.

Data to be written into non-volatile memory 10 is presented on lines 54 and 55 for entering data into memory cells of column 1 and column N, respectively. Data on line 54 is coupled through buffer 56 and transistor 50 to line 57. Line 57 is coupled to the source of transistors 18 and 20. Line 57 is also coupled to an input of sense amplifier 58 having an output line 59 which holds the data read from memory 10. Data in on line 55 is coupled through buffer 60 and transistor 51 to line 61 which is coupled to the source of transistors 19 and 21. Line 61 is also coupled to the input of sense amplifier 62 which has an output coupled to line 63 which holds the output data at times memory 10 is read.

The interconnection of memory 10 is completed with the drain of transistors 18 through 21 coupled to the souce of transistors 26 through 29, respectively, over lines 66 through 69 as shown in FIG. 1.

Memory cell 12 has certain fixed capacitances 71 and 72 and variable capacitances 73 through 75. Capacitance 71 represents the gate to source capacitance, $C_{GS}$ of transistor 26. Capacitance 72 represents the total capacitance of line 66 and the source of transistor 26 and the drain of transistor 18 with respect to the substrate or body of transistor 26 as represented by line 52. When transistor 26 is in the depletion mode, an N-channel is formed underneath the gate which extends to the source causing the channel and source to be at a common potential. Variable capacitor 73 represents the gate to source capacitance $C_{GS}$ due to the presence of the channel. Variable capacitor 74 represents the source to body capacitance $C_{SB}$ due to the presence of the channel. Variable capacitor 75 would be zero capacitance at times a channel is present below transistor 26 since the capacitance is represented by variable capacitances 73 and 74. When transistor 26 is in the enhancement mode, no channel is formed below the gate region and capacitance 75 would represent the gate to body capacitance $C_{GB}$. Variable capacitances 73 and 74 would be zero since no channel exists. Thus, when transistor 26 is in the depletion mode with an N-channel formed below the gate region, capacitances 71, 72, 73 and 74 depict the proper model. When transistor 26 is in the enhancement mode, capacitances 71, 72 and 75 depict the proper model.

The capacitance model for memory cell 13 is represented by capacitances 76 through 80 which function in like manner as previously described for the capacitances 71 through 75 of memory cell 12.

In operation of the embodiment of FIG. 1, row decoder lines 38 and 39 typically have voltages of 0 or +5 volts with the selected row being at +5 volts. The output of buffers 56 and 60 are typically 0 and +5 volts depending upon the data on the input line. Sense amplifiers 58 and 62 typically respond to input voltage variations of 50 millivolts or more to provide an output on data output of, for example, 0 or +5 volts. The body of fixed threshold transistors 18 through 21 and variable threshold transistors 26 through 29 are commonly coupled together to a potential such as 0 volts. The gate of variable threshold transistors 26 through 29 are commonly connected together.

The writing sequence of data into non-volatile memory 10 begins with an erase pulse on memory gate line 45 which may, for example, be −15 volts with respect to the body of variable threshold transistors 26 through 29. Transistor 43 functions to respond to a control signal "erase" on line 42 to cause −15 volts to be connected to line 45 through transistor 43. Non-volatile memory 10 may have selected variable threshold transistors erased such as by column, row or block by subdividing the memory gate line to correspond to the selected transistors. In place of applying −15 volts to the memory gate line, a positive 15 volts may be applied to the body of the variable threshold transistors 26 through 29 such as by raising line 52 to +15 volts while the memory gate line 45 is held at 0 volts. Raising the body of variable threshold transistors 26 through 29 may be particularly attractive with silicon on sapphire structures where the body of variable threshold transistors 26 through 29 is isolated from the substrate of row decoder 37, sense amplifiers 58 and 62, buffers 56 and 60, and transistors 50 and 51.

When the gate to body voltage is −15 volts, the threshold voltage, $V_T$, of variable threshold transistors 26 through 29 is shifted negative since positive charge is drawn into and trapped in the gate dielectric. The variable threshold transistor is shifted into the depletion mode wherein an N-channel is present in the body below the gate of transistor at times the gate voltage is 0 volts. The N-channel or N-inversion layer represents a logic "one". The absence of an N-inversion layer when the gate voltage is zero represents a logic "0". When no channel exists when the gate voltage is 0 volts, the transistor is considered to be in the enhancement mode. Thus, the depletion mode is characterized by a channel below the gate region at 0 potential while the enhancement mode is characterized by no channel being present the gate voltage of 0 volts.

With all of the variable threshold transistors 26 through 29, written to the logic "one" state, only those transistors where a logic "zero" is desired is written in response to a logic zero on the data in line. A logic zero is written by placing a positive voltage across the gate to drain of the variable threshold transistor causing the threshold voltage to shift to the enhancement mode.

Figure 2:
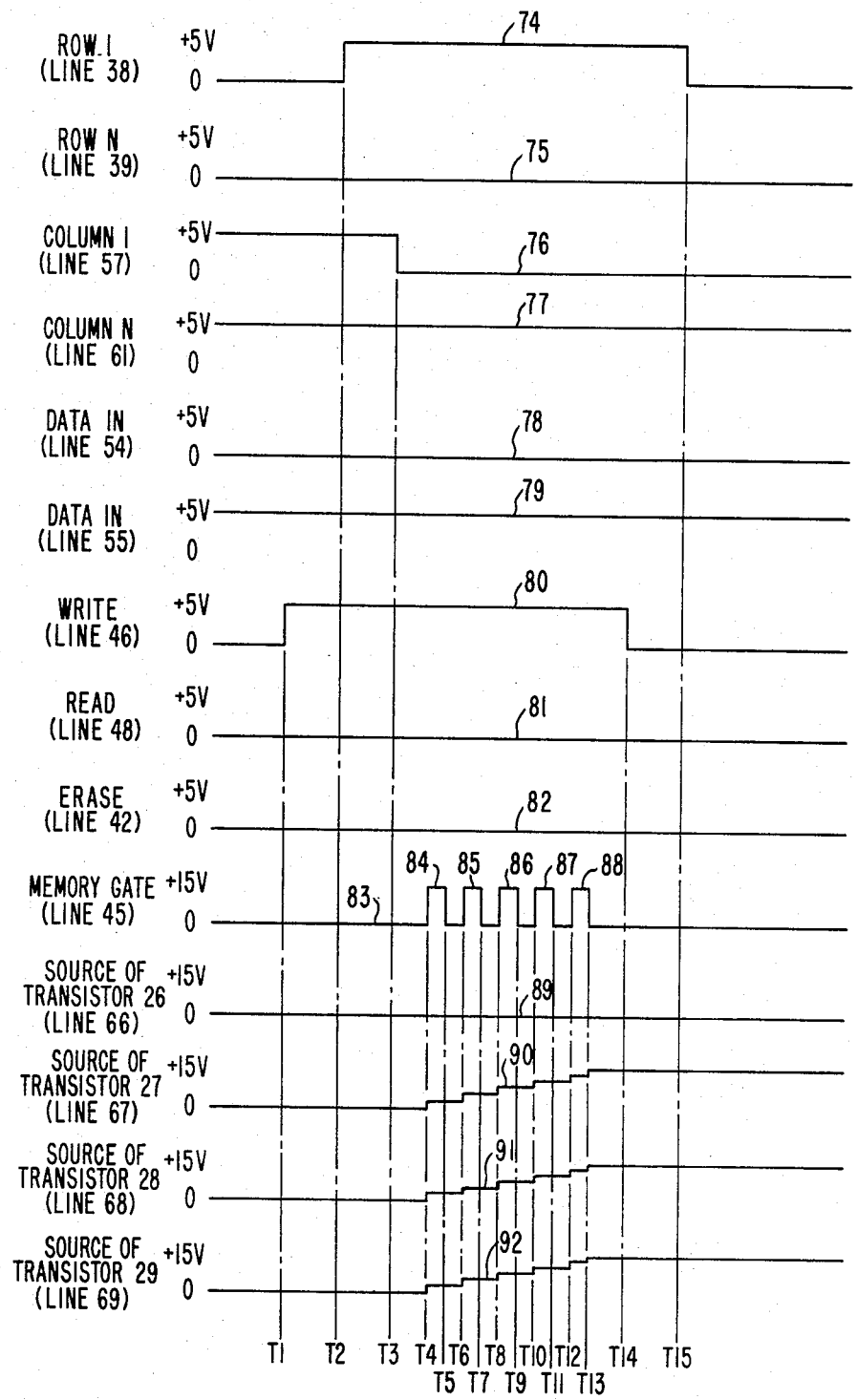
FIG. 2 shows waveforms for write operation of the embodiment of FIG. 1.

Referring to FIG. 2, waveforms 74 through 92 are shown for writing a selected variable threshold transistor, transistor 26 to the logic "zero" state. At time T1, control signal write goes from 0 volts to +5 volts. Transistors 50 and 51 are turned on causing the data at the input of buffers 56 and 60 to pass through transistors 50 and 51 to columns 1 and N on lines 57 and 61, respectively. In response to the address signals A1 through AN and control signal write to row decoder 37, row 1 line 38, is selected by the row decoder, at time T2. Row 1 goes from zero to +5 volts; row 1 being the selected row. Row N remains at zero volts as one of the unselected rows. If the data in on line 54 is 0 volts, then line 57 would go from +5 volts to zero volts at time T3 on response to transistor 50 being turned on. The data in on line 55 of +5 volts will cause column N, line 61, to remain at +5 volts. With row 1, line 38 at +5 volts, transistor 18 will be conducting causing the voltage on line 57 of column 1 to pass through transistor 18 to the source of transistor 26 and clamping the source at 0 volts. Transistor 19 will be non-conducting since line 61 is at +5 volts and the gate of transistor 19 is at +5 volts. The source of transistor 27 will therefore be isolated from line 61.

Non-selected rows such as row N, line 39, will be at zero volts causing row selection transistors 20 and 21 to be non-conducting thereby isolating the source of transistors 28 and 29, respectively, from lines 57 and 61.

At times T4, T6, T8, T10 and T12, the memory gate of variable threshold transistors 26 through 29 go from 0 volts to +15 volts. At times T5, T7, T9, T11 and T13, the memory gate, line 45, goes from +15 volts to 0 volts. Thus, from T4 through T5, the memory gate of transistors 26 through 29 are pulsed to +15 volts followed by a pulse at times T6 through T7 and so forth to form five pulses from time T4 through T13.

The sequence or series of positive pulses on the memory gate of transistors 26 through 29 causes charge to be capacitively coupled to its source. Since the source of transistor 26 and its channel is clamped to 0 volts, a full 15 volts will appear between the gate and source causing the threshold voltage $V_T$ of transistor 26 to shift more negative causing the transistor to be in the enhancement mode where no channel will form at 0 gate bias.

The sequence of positive pulses on the gate of variable threshold transistor 27 will cause the source and channel to charge up to close to 15 volts causing little or no voltage to be across the gate insulator. Since an N-channel is present underneath the gate of transistor 27, the voltage across the gate insulator will be determined by 15 volts times the sum of capacitances 77 and 79 divided by the sum of capacitances 76 through 79. Capacitance 80 is more accurately represented by capacitances 78 and 79 at times when an N-channel is present.

A sequence of positive pulses to the gate of transistors 28 and 29 will cause its respective source lines 68 and 69 to charge close to 15 volts by capacitance division since transistors 20 and 21 are non-conducting. It should be noted that since transistors 27 through 29 have an N-channel or inversion layer below its gate region as represented by capacitance 78 which should be large with respect to the capacitance between the source and body, capacitance 77 and the capacitance between the N-channel and body, capacitance 79. The source is quickly charged to close to 15 volts which thereby reduces the voltage across the memory gate insulator to near 0 volts causing no shift in the threshold voltage. Curves 90 through 92 show the charging of the source of transistors 27 through 29 in response to positive pulses 84 through 88 of the voltage on line 45. At T14, control signal write goes from +5 volts to 0 volts as shown by waveform 80 in FIG. 2. Thereafter, columns 1 through N such as lines 57 and 61 remain floating;

transistors 50 and 51 are non-conducting. At time T15, row 1, line 38, goes from 5 volts to 0 volts since all lines are deselected when control signal write at time T14 goes from +5 volts to 0 volts. Thus all those selection transistors in memory 10 such as transistors 18 through 21 are non-conducting causing circuit nodes 66 through 69 to be isolated and floating.

Figure 3:
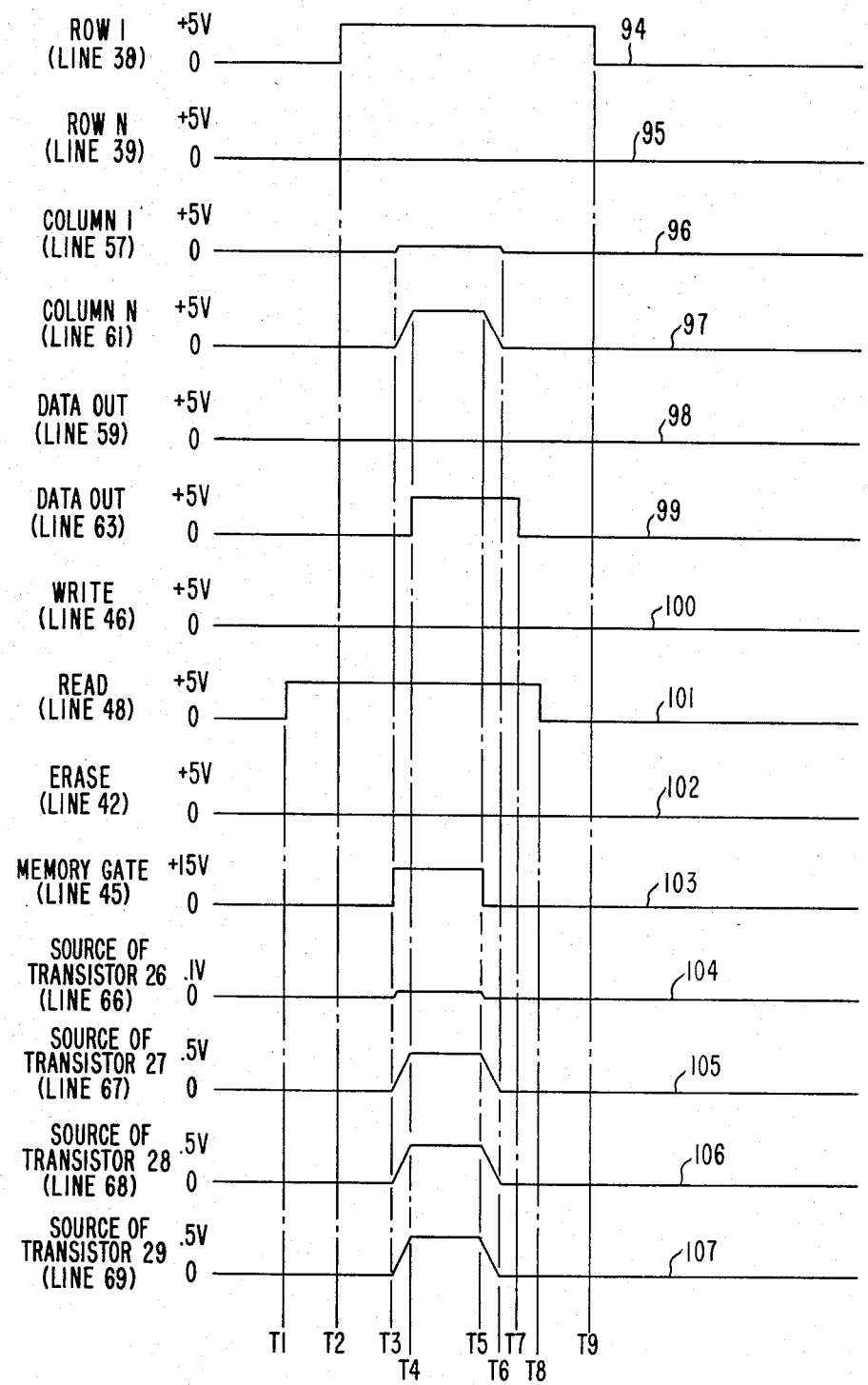
FIG. 3 shows waveforms for read operation of the embodiment of FIG. 1.

To read out data from memory 10, read control signal "read" on line 48, goes from 0 to +5 volts at time T1 as shown in FIG. 3. Row decoder 37 responds to the read signal and the address signals on lines 34 through 36 to select a row such as row 1. At time T2, selected row 1 on line 38 goes from 0 to +5 volts causing row selection transistors 18 and 19 to be conducting. All other outputs from row decoder 37 remain at 0 volts such as row N on line 39 shown in FIG. 3. Therefore, all other row selection transistors such as transistors 20 and 21 remain non-conducting. At time T3, the voltage on line 45 going to the memory gates of transistors 26 through 29 goes from 0 to +15 volts. Since transistor 26 is in the enhancement mode, no channel is present below the gate and therefore the capacitance coupling to the source is low causing the source voltage to go from 0 volts to 0.1 volts.

Since transistor 27 is in the depletion mode, an N channel exists underneath the gate region and therefore, the capacitive coupling from the gate to source is high causing a large voltage to appear on the source of transistor 27 such as 0.5 volts. Likewise, the source of transistors 28 and 29 have large capacitive coupling to its source since both transistors are in the depletion mode and therefore the source rises from 0 volts to 0.5 volts. It is noted that transistors 20 and 21 are non-conducting, therefore isolating the source of transistors 28 and 29 from the column lines 57 and 61 respectively. With transistors 18 and 19 conducting, the source of transistors 26 and 27 are coupled to column lines 57 and 61, respectively. Sense amplifiers 58 and 62 responding to the voltage on lines 57 and 61 provide a 0 volt output for on line 59 and a 30 5 volts output on line 63. The 0 volt output represents a logic 0 while the 5 volts on line 63 represents a logic one. A slight propagation delay occurs with sense amplifiers 58 and 62 with the outputs on lines 59 and 63 occurring at times T4. At time T5, the voltage on memory gate line 45 goes from +15 volts to 0 volts which in turn discharges the voltage on the source of transistors 26 through 29 bringing them back to 0 volts at time T6. At time T7, the output of sense amplifier 62 goes from +5 volts to 0 volts is shown by waveform 99 in FIG. 3. At time T8, control signal "read" on line 38 goes from +5 volts to 0 volts as shown by waveform 101 in FIG. 3. At time T9, row decoder 37 in response to control signal read goes from +5 volts to 0 volts as shown by waveform 94 in FIG. 3. At time T9, all rows from row decoder 37 are deselected and at 0 volts.

The access time to memory 10 may be improved by application of a small negative going pulse on the memory gate, line 45, such as 0 to −5 volts in place of the positive read pulse shown by waveform 103 in FIG. 3. With a negative going pulse on the memory gate, the selection transistor acts as a common gate voltage amplifier driver.

Figure 4:
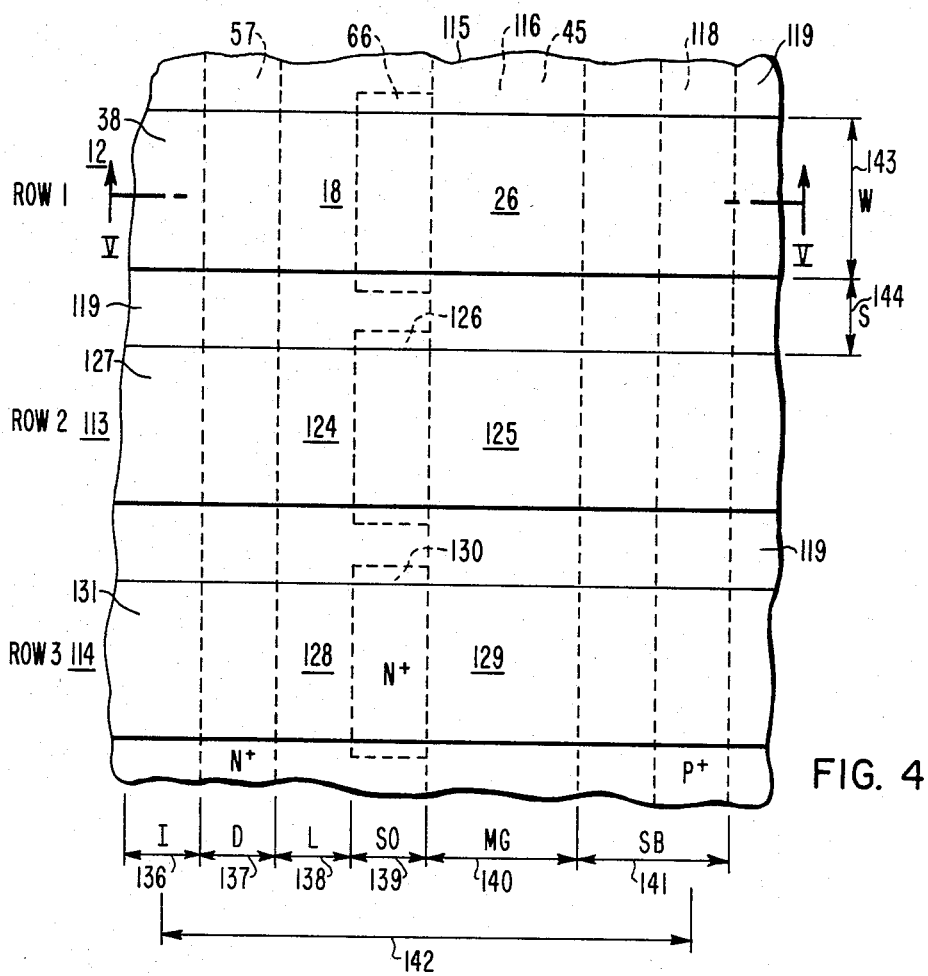
FIG. 4 is a plan view showing the construction of the embodiment in FIG. 1.
Figure 5:
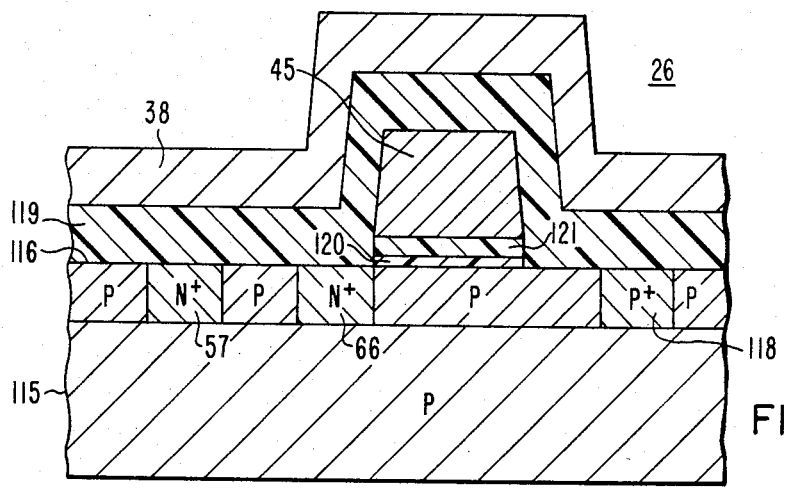
FIG. 5 is a cross-section view taken along the lines V—V of FIG. 4.

Referring to FIG. 4 a plan view of a portion of non-volatile memory 10 shown in FIG. 1 is shown depicting the lay-out of memory cell 12 along with adjacent memory cells 113 and 114. A substrate 115 of semiconductor material such as P type silicon having an upper surface 116 which may, for example, be in the (100) crystalline plane of silicon. Alternatively, substrate 115 may be sapphire with a layer of silicon thereover. FIG. 5 shows a cross-section view along the lines V—V of FIG. 4. Transistor 18 has an N+ region 66 and a second spaced apart N+ region 57 which acts as the drain and source, respectively. Metallization 38 acts as the gate of transistor 18. N+ region 66 while acting as the drain of transistor 18 also acts as the source of transistor 26. Substrate 115 acts as the body of transistors 18 and 26. Conductive material 45 which may, for example, be aluminum or polysilicon functions as the gate of transistor 28 shown in more detail in FIG. 5. P+ region 118 formed in the upper surface 116 of substrate 115 forms a low conductance voltage bus through memory 10 and a source of carriers in the body of transistor 26. As can be seen in FIG. 5, the gate dielectric for transistor 18 is provided by a silicon oxide layer 119 which also functions to insulate line 45 from metallization 38 where they cross over each other. The gate dielectric of transistor 26 is formed by a layer of silicon dioxide 120 and silicon nitride layer 121 which are adjusted in thickness to provide for trapping of charge, electrons or electron vacancies (holes). By trapping or storing charge in the gate dielectric 120 and 121, transistor 26 exhibits a variable threshold characteristic. Adjacent to memory cell 12 is memory cell 113 which has the same structure as memory cell 12. Memory cell 113 is associated with row 2 in non-volatile memory 10 as shown in FIG. 4. Adjacent memory cell 113 is memory cell 114 associated with row 3 of non-volatile memory 10. Memory cell 114 has the same structure as memory cell 12. Memory cell 113 has a row selection transistor 124 and variable threshold transistor 125. An N+ region 126 serves as the drain for transistor 124 and the source of transistor 125. Metallization 127 functions as the gate of transistor 124. Memory cell 114 has a row selection transistor 128 and a variable threshold transistor 129. An N+ region 130 functions as the drain for transistor 128 and the source for transistor 129. Metallization 131 functions as the gate of transistor 128. Conductor line 45 as shown in FIG. 4 functions as the gate electrode of transistors 26, 125 and 129.

The memory array layout shown in FIG. 4 for memory cells 12, 113 and 114 may have corresponding memory cells 12″, 113″ and 114- laid out showing P+ region 118 as the start of the memory cell corresponding to the mirror image or the folding over about an axis in P+ region 118 of memory cells 12, 113 and 114. The dimensions and bit density for design rules corresponding to 1, 2 and 3 micrometers are shown in Table 1.

for one micrometer design rolls, a row pitch of 3 micrometers and a column pitch of 6 micrometers is possible as delineated in Table I, and giving a memory cell area of 18 micrometers squared and a cell density of 5.56 megobits per centimeter squared. If two memory cells are required per bit, then the bit density will be halved. It is noted that in the layout of memory cells 12, 113 and 114, as shown in FIG. 4, that no interconnect contact window is required within the memory cell which will enhance fabrication yield, circuit reliability and memory cell density.

Figure 6:
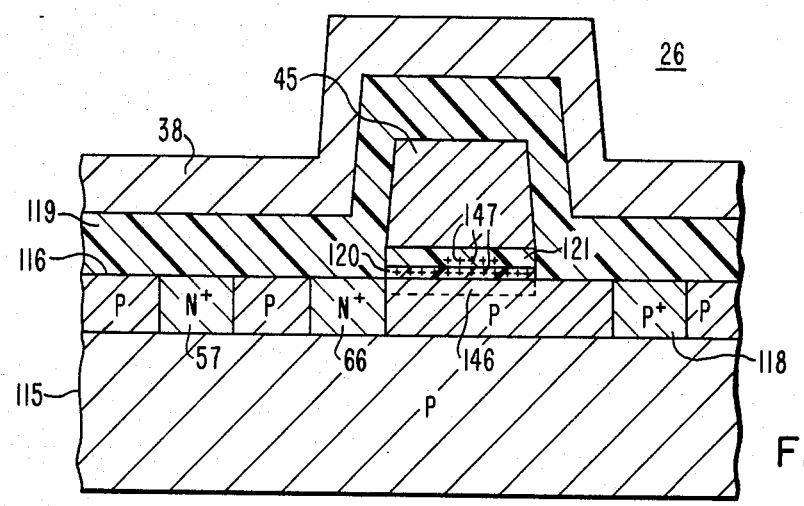
FIG. 6 is a cross-section view taken along the lines V—V of FIG. 4 showing trapped charge in the gate dielectric and a channel below.

The process steps required for the fabrication of the capacitor memory cell with peripheral N- and P-channel (CMOS) logic circuits are the following:

Start with P type Si(100) Or silicon-on-Sapphire
1. Nitride deposition
2. Photomask 1—oxide isolation areas
3. Implant boron for field region and grow field oxide, remove nitride
4. Grow 400 Angstroms gate oxide
5. Photomask 2—memory window definition
6. Deposit silicon nitride (300 Angstroms)
7. Photomask 3—nitride removal from gate region
8. Etch nitride
9. Deposit phosphorous doped polysilicon (LPCVD and silox layer for both N and P channel)
10. Photomask 4—P+ source and drain (etch poly)
11. Boron ion implant and deposit silox
12. Photomask 5—N+ source and drain etch poly
13. Ion implant for N+ regions
14. Anneal ion implant
15. Deposit oxide over first poly and reflow silox
16. Photomask 6—define memory gate bus (remove first poly from row line transistors)
17. Photomask 7—contact windows to N and P transistors in peripheral logic circuits
18. Deposit second poly or Al for row lines
19. Photomask 8—define metal level
20. Deposit silox
21. Photomask 9—via mask Referring to FIG. 6 when charge is stored in the gate dielectric of transistor 26 an inversion region or N channel 146 is formed. Charge such as holes or electron vacancies 147 are shown in silicon oxide layer 120 and silicon nitride layer 121. FIG. 6 shows transistor 26 in the logic one state with an N inversion layer 146 while FIG. 5 shows transistor 26 in the logic zero state with no N inversion layer.

Figure 7:
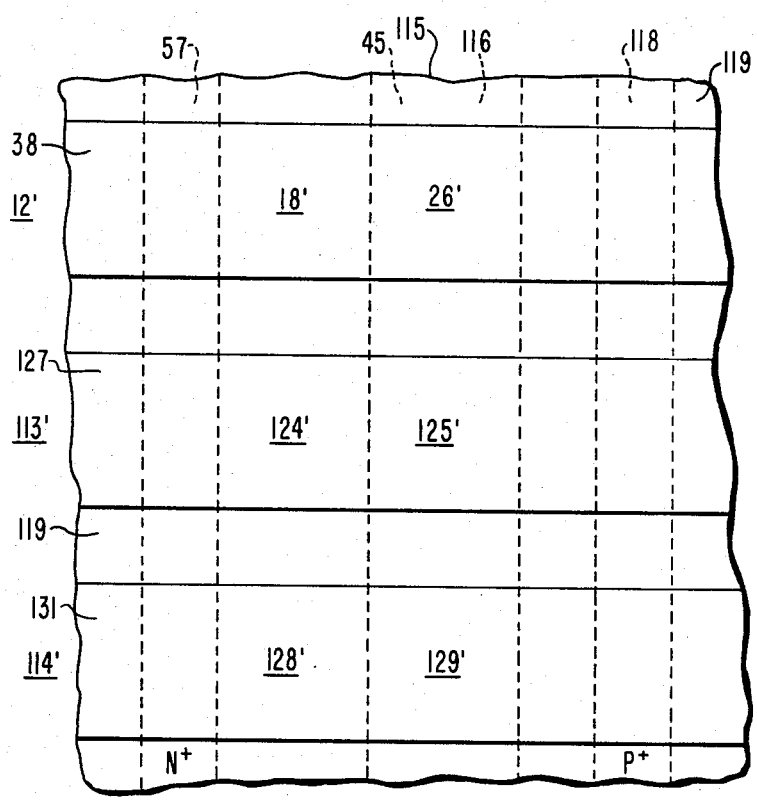
FIG. 7 is a plan view of an alternate embodiment of the invention.

FIG. 7 is an alternate embodiment of the invention wherein memory cells 12′, 113′, and 114′ correspond to

TABLE I

| DESIGN RULES | I | D | L | S | MG | SB | COLUMN PITCH | W | S | ROW PITCH | CELL AREA | DENSITY |
|---|---|---|---|---|---|---|---|---|---|---|---|---|
| 1 μm | 1 | 1 | 1 | 1 | 2 | 1 | 6 μm | 2 | 1 | 3 μm | 18 μm² | 5.56 MBits/cm² |
| 2 μm | 2 | 2 | 2 | 2 | 3 | 2 | 11 μm | 3 | 2 | 5 μm | 55 μm² | 1.82 MBits/cm² |
| 7 μm | 3 | 3 | 3 | 3 | 5 | 3 | 17 μm | 5 | 3 | 8 μm | 136 μm² | 0.74 MBits/cm² |

Dimensions I, D, L, SO, MG and SB correspond to the dimensions shown by arrows 136–141 respectively in FIG. 4.

These dimensions are in the row direction and result in a column pitch shown by arrow 142 in FIG. 4 which is the center to center spacing for memory cell 12 which may be repeated to form adjacent columns. Dimensions W and S shown by arrows 143 and 144 in FIG. 4 correspond to the row pitch of one memory cell which may be repeated to form a plurality of rows. For example, the layout shown in FIG. 4 except for the deletion of regions 66, 126 and 130. In FIG. 7 like references are used for functions corresponding to the apparatus of FIG. 4. As compared to FIG. 4, N+ regions 66, 126 and 130 are deleted in that the isolation between the row line such as row 1, line 38 and the memory gate line, line 45, does not interfere with the threshold voltage of the row select transistor, transistor 18.

Referring to FIG. 1, read waveform generator 49, write waveform generator 47 and transistor 43 may be located off the chip or electrically separate in an isolated region from the rest of the substrate containing memory 10. Since memory gate line 45 is the only line carrying high voltage, +15 volts, no voltage isolation is required for other circuitry beyond normal circuit values of +5 volts. In other words, transistors 18–21 and 26–29 need not be placed in a separate P-type region isolated from the row decoder by an N region. Likewise, the sense amplifiers 58 and 62 and buffers 56 and 60 do not require a separate P+ region from the P+ region of the transistors 18–21 and 26–29. The memory gate line 45 is isolated outside the memory gate regions by the silicon dioxide 119 which should be thick enough to withstand +15 volts. If memory gate line 45 is coupled to a bonding pad, input protection from static electricity and voltage transients may be provided by a resistance in series with the memory gate line 45 or by the ohmic resistance of memory gate line 45 itself and by an internal decoupling capacitor. An alternative means uses a plurality of N+/P+ polysilicon diodes fabricated on the silicon dioxide 119 coupled between the memory gate line 45 and the body of the transistors line 52 with a series resistance incorporated in the memory gate line 45. For a more detailed description of a plurality of polysilicon diodes coupled in series, reference is made to U.S. patent application Ser. No. 239,806, filed on Feb. 27, 1981, by Alfred P. Turley which is incorporated herein by reference.

If read waveform generator 49, write waveform generator 47 and transistor 43 are fabricated on the same chip with transistors 18–21 and 26–29, isolation regions or silicon islands on sapphire are required to withstand the 15 volts potential. Control signals read, write and erase may be low voltage control signals having a voltage swing from 0 to 2.5 volts or 0 to 5 volts. Write waveform generator 47 may be fabricated using polysilicon diode capacitor voltage multiplication circuits on the field oxide 119. Similarly, the voltage necessary to erase such as +15 volts may be generated by polysilicon diode capacitor voltage multiplication circuits on the silicon dioxide 119.

Where it is desired to have groups of rows or columns separated for a smaller block erase, then extra memory gate lines are required to be routed to the separate groups. Since normally the erase and write control circuits may be slow compared to the read data times, the requirement for several memory gate lines and for off-chip selection of the memory gate lines does not impose design restrictions.

The present invention describes a common memory gate metal nitride oxide semiconductor (MNOS) memory that is unique because the memory gate write line is common to all MNOS memory elements and is isolated from the silicon substrate by the field oxide. All of the address and control logic within the silicon substrate requires only low voltage logic levels, 0 to +2.5 volts or 0 to +5 volts. Since the need for substrate isolation is eliminated, the processing sequence is compatible with commercial silicon gate N-channel or CMOS bulk silicon or silicon on sapphire technology. The present invention allows 1 micrometer device technology to be applied to form high density MNOS non-volatile memories.

The invention provides an MNOS memory for storing non-volatile data comprising an array of N-channel fixed threshold field effect transistors each having a gate, source and drain region with the transistors arranged in a plurality of rows and columns, the source of each transistor in a column coupled together and to a sense amplifier, the gate of each transistor in a row coupled together and to a row decoder, the drain of each transistor coupled to the source of a variable threshold non-volatile field effect transistor device having a source region, a gate electrode and a gate dielectric below the gate region for storing charge for providing an N conductive channel in its semiconductor body in response to said charge and for providing a P region at times the charge is removed, the gate region of each variable threshold non-device in the array coupled together, means for placing predetermined voltages on each row line and column line, means for placing a predetermined voltage on the gate line of the variable threshold device with respect to its body to cause charge to be stored in each variable threshold device and means for placing a control signal including a plurality of pulses on the gate line to remove charge from a selected non-volatile device.

I claim:

1. Apparatus for storing data in non-volatile form comprising:
   an array of N channel field effect transistors each having a gate electrode, source and drain region, said transistors arranged in a plurality of rows and columns;
   the source region of each said transistor in a column coupled together and to a sense amplifier;
   the gate electrode of each said transistor in a row coupled together and to a row decoder;
   the drain region of each said transistor coupled to the source region of a variable threshold non-volatile device having a source region, a body and a gate electrode, said gate electrode of each variable threshold non-volatile device in said array coupled together and isolated by dielectric material from the body of said transistors and devices;
   said row decoder including first means for placing predetermined voltages on the gate electrode of such transistors in each row;
   second means for placing a predetermined voltage at first times on said gate electrode with respect to its body of each variable threshold non-volatile device to cause charge to be stored in each non-volatile device;
   third means for placing voltages indicative of date to be stored on the source region of said transistors in each column; and
   fourth means for placing a control signal including a plurality of pulses at second times on said gate electrode of each variable threshold non-volatile device to remove charge from a non-volatile device in a row selected by said row decoder and in response to said third means.

2. The apparatus of claim 1 wherein said second means includes a predetermined voltage of at least −15 volts.

3. The apparatus of claim 1 wherein said variable threshold non-volatile device includes a gate dielectric including a layer of silicon dioxide and a layer of silicon nitride and source region of N-type silicon.

4. The apparatus of claim 1 wherein said fourth means includes said control signal with pulses having an amplitude of at least 15 volts.

5. The apparatus of claim 1 further including fifth means for placing a control signal including a plurality of pulses at third times on said gate electrode of each variable threshold non-volatile device to provide an output signal indicative of the data stored in said variable threshold non-volatile device at the source region of said transistor having its drain coupled to said device in a row selected by said row decoder.

6. The apparatus of claim 5 wherein said pulses have an amplitude of at least 5 volts.

7. The apparatus of claim 5 wherein said pulses have an amplitude of at least −5 volts.

8. The apparatus of claim 1 wherein the drain region of each said transistor is also the source region of said variable threshold non-volatile device.

9. The apparatus of claim 1 wherein said gate electrode of each variable threshold non-volatile device is coupled together and to a fifth means for providing overvoltage clamping and dissipation.

10. Apparatus for storing date in non-volatile form comprising:
- an array of N-channel field effect transistors each having a first and second gate electrode, a source region, a body, a fixed threshold gate dielectric under said first gate electrode, a variable threshold gate dielectric under said second gate electrode, said transistors arranged in a plurality of rows and columns;
- the source region of each said transistor in a column coupled together and to a sense amplifier;
- the first gate electrode of each said transistor in a row coupled together and to a row decoder;
- the second gate electrode of each said transistor in said array coupled together and to a common memory gate line which is isolated from the variable threshold transistor body;
- said row decoder including first means for placing predetermined voltages on the first gate electrode of said transistors in each row;
- second means for placing a predetermined voltage at first times on said second gate electrode with respect to its body to cause charge to be stored in each transistor in the gate dielectric below said second electrode,
- third means for placing voltages indicative of data to be stored on the source region of said transistors in each column; and
- fourth means for placing a control signal including a plurality of pulses at second times on said second gate electrode to remove charge from the gate dielectric below said second electrode in a row selected by said row decoder and in response to said third means.

11. The apparatus of claim 10 wherein said second means includes a predetermined voltage of at least −15 volts.

12. The apparatus of claim 10 wherein said variable threshold gate dielectric includes a layer of silicon dioxide and a layer of silicon nitride.

13. The apparatus of claim 10 wherein said fourth means includes said control signal with pulses having an amplitude of at least 15 volts.

14. The apparatus of claim 10 further including fifth means for placing a control signal including a plurality of pulses at third times on said second gate electrode of each transistor to provide an output signal indicative of the data stored in the transistor at the source region of said transistor in a row selected by said row decoder.

15. The apparatus of claim 14 wherein said pulses have an amplitude of at least 5 volts.

16. The apparatus of claim 14 wherein said pulses have an amplitude of at least −5 volts.

17. The apparatus of claim 10 wherein said second gate electrode of each transistor is coupled together and isolated by dielectric material from the body of said transistors.

18. The apparatus of claim 10 wherein said second gate electrode of each variable threshold non-volatile device is coupled together and to a fifth means for providing overvoltage clamping and dissipation.

19. A non-voltile semiconductor memory cell comprising:
- a fixed threshold transistor and a variable threshold transistor disposed within a common semiconductor body,
- said fixed threshold transistor having a source, gate, and drain,
- said variable threshold transistor having a source, gate and body and functions to store data by the presence or absence of a channel formed in said body,
- the gate electrode of the variable threshold transistor of each memory cell isolated by dielectric material from the body of the variable threshold transistor, which gate electrode of each memory cell is coupled together and adapted for coupling to a memory gate signal,
- said drain of said fixed threshold transistor coupled to the source of said variable threshold transistor,
- said gate of said fixed threshold transistor adapted for coupling to a memory cell select signal,
- said source of said fixed threshold transistor adapted for coupling to a sense amplifier during a read operation and to a voltage indicative of a logic state to be stored during a write operation; and
- said memory gate signal having an erase pulse at first times, a sequence of write pulses at second times and a sequence of read pulses at third times.

20. The memory cell of claim 19 wherein said variable threshold transistor has a gate dielectric including a layer of silicon dioxide and a layer of silicon nitride.

21. The memory cell of claim 19 wherein said fixed threshold transistor and said variable threshold transistor are N-channel field effect transistors.

22. The memory cell of claim 19 wherein said fixed threshold transistor and said variable threshold transistor are P-channel field effect transistors.

* * * * *